(12) United States Patent
Lee (10) Patent No.: US 11,308,995 B2
(45) Date of Patent: Apr. 19, 2022

(54) SEMICONDUCTOR APPARATUS AND SEMICONDUCTOR MEMORY APPARATUS

(71) Applicant: SK hynix Inc., Icheon-si (KR)

(72) Inventor: Hyun Chul Lee, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/148,201

(22) Filed: Jan. 13, 2021

(65) Prior Publication Data

US 2022/0028432 A1 Jan. 27, 2022

(30) Foreign Application Priority Data

Jul. 21, 2020 (KR) .................. 10-2020-0090325

(51) Int. Cl.
*G11C 5/14* (2006.01)
(52) U.S. Cl.
CPC .................... *G11C 5/148* (2013.01)
(58) Field of Classification Search
CPC ........................................... G11C 5/148
See application file for complete search history.

(56) References Cited

U.S. PATENT DOCUMENTS

| | | | |
|---|---|---|---|
| 7,602,225 B2 * | 10/2009 | Seo | G06F 1/24 327/142 |
| 8,711,606 B2 | 4/2014 | Behrends et al. | |
| 9,786,371 B1 * | 10/2017 | Lee | G11C 7/20 |
| 9,899,065 B1 * | 2/2018 | Lee | G11C 7/20 |
| 2016/0133302 A1 * | 5/2016 | Son | G11C 8/08 365/226 |
| 2017/0011780 A1 * | 1/2017 | Kim | H03K 17/223 |
| 2021/0375331 A1 * | 12/2021 | Kim | G11C 5/147 |

FOREIGN PATENT DOCUMENTS

KR 100468723 B1 1/2005

* cited by examiner

*Primary Examiner* — Khamdan N. Alrobaie
(74) *Attorney, Agent, or Firm* — William Park & Associates Ltd.

(57) ABSTRACT

A semiconductor apparatus including a sudden power detection circuit, a power-on reset circuit, and a driving circuit. The sudden power detection circuit configured to detect an external power supply voltage and generate a sudden power detection signal. The power-on reset circuit configured to detect the voltage level of the external power supply voltage according to a reset reference voltage and generate a power-on reset signal. The driving circuit configured to perform a sudden power-off operation and a power-on reset operation.

20 Claims, 6 Drawing Sheets

FIG. 6

SEMICONDUCTOR APPARATUS AND SEMICONDUCTOR MEMORY APPARATUS

CROSS-REFERENCES TO RELATED APPLICATION

The present application claims priority under 35 U.S.C. § 119(a) to Korean application number 10-2020-0090325, filed on Jul. 21, 2020, in the Korean Intellectual Property Office, which is incorporated herein by reference in its entirety.

BACKGROUND

1. Technical Field

Various embodiments generally relate to a semiconductor apparatus and a semiconductor memory apparatus, and more particularly, to a semiconductor apparatus and a semiconductor memory apparatus related to performing a sudden power-off operation and a power-on reset operation.

2. Related Art

In general, semiconductor apparatuses perform circuit operations by using internal power supply voltages generated based on an external power supply voltage. Similarly, semiconductor memory apparatuses including volatile memory devices and nonvolatile memory devices also perform circuit operations by using internal power supply voltages generated based on an external power supply voltage.

Meanwhile, the volatile memory device has an advantage in that a high data processing speed that is a speed for storing external data therein or outputting internal data to an exterior is high. However, the volatile memory device has a disadvantage in that it needs to continuously receive an external power supply voltage in processing data. On the other hand, the nonvolatile memory device has a disadvantage in that a data processing speed is slow. However, the nonvolatile memory device has an advantage of retaining data previously stored therein even though no external power supply voltage is supplied.

The nonvolatile memory device performs a program operation in order to store data in a memory cell, and performs a read operation in order to output the data stored in the memory cell. Furthermore, the nonvolatile memory device performs an erasing operation in order to erase the data stored in the memory cell before the program operation. As described above, even though no external power supply voltage is supplied, the nonvolatile memory device may retain the data previously stored therein. However, when the external power supply voltage is not smoothly supplied during the program operation, the read operation, or the erasing operation, the data stored in the memory cell may be damaged.

In detail, the nonvolatile memory device applies a high voltage to a word line, a bit line, and a source line during the program operation, the read operation, or the erasing operation. Therefore, when the external power supply voltage is not smoothly supplied during the program operation, the read operation, or the erasing operation, a voltage level of the high voltage applied to a corresponding line may be undesirably lowered. In such a case, a data distribution of a memory cell connected to the corresponding line is changed due to an influence of the voltage level of the undesirably lowered high voltage. The change in the data distribution of the memory cell means a change in the data stored in the memory cell. Furthermore, the change in the data stored in the memory cell means that it is not possible to guarantee reliability of data.

SUMMARY

In an embodiment, a semiconductor apparatus may include: a sudden power detection circuit enabled based on an enable signal and configured to detect a voltage level of an external power supply voltage and generate a sudden power detection signal; a power-on reset circuit configured to set a reset reference voltage for a power-on reset operation based on the enable signal and a power-on reset signal, to detect the voltage level of the external power supply voltage according to the reset reference voltage, and to generate the power-on reset signal; and a driving circuit configured to perform a sudden power-off operation based on the sudden power detection signal and to perform the power-on reset operation based on the power-on reset signal.

In an embodiment, a semiconductor memory apparatus may include: a sudden power detection circuit enabled based on an enable signal and configured to detect a voltage level of an external power supply voltage and generate a sudden power detection signal; a power-on reset circuit configured to set a reset reference voltage for a power-on reset operation based on the enable signal and a power-on reset signal, to detect the voltage level of the external power supply voltage according to the reset reference voltage, and to generate the power-on reset signal; and a discharging circuit configured to perform a discharging operation on a line connected to a memory cell, based on the sudden power detection signal.

DETAILED DESCRIPTION

The description of the present disclosure is merely an embodiment for a structural and/or functional description. The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of terms described in this application should be understood as follows.

The terms, such as the "first" and the "second", are used to distinguish one element from another element, and the scope of the present disclosure should not be limited by the terms. For example, a first element may be named a second element. Likewise, the second element may be named the first element.

An expression of the singular number should be understood as including plural expressions, unless clearly expressed otherwise in the context. The terms, such as "include" or "have", should be understood as indicating the existence of a set characteristic, number, step, operation, element, part, or a combination thereof, not excluding a possibility of the existence or addition of one or more other characteristics, numbers, steps, operations, elements, parts, or a combination thereof.

In each of steps, symbols (e.g., a, b, and c) are used for convenience of a description, and the symbols do not describe order of the steps. The steps may be performed in order different from order described in the context unless specific order is dearly described in the context. That is, the steps may be performed according to described order, may be performed substantially at the same time as the described order, or may be performed in reverse order of the described order.

All the terms used herein, including technological or scientific terms, have the same meanings as those that are typically understood by those skilled in the art, unless otherwise defined. Terms defined in commonly used dictionaries should be construed as having the same meanings as those in the context in related technology and should not be construed as having ideal or excessively formal meanings, unless clearly defined in the application.

Various embodiments may be directed to providing a semiconductor apparatus and a semiconductor memory apparatus capable of stably controlling a sudden power-off operation and a power-on reset operation.

Various embodiments are directed to providing a semiconductor apparatus and a semiconductor memory apparatus capable of stably controlling a power-on reset operation based on a change in the characteristics of a transistor according to a process, a voltage, and a temperature.

An embodiment has an effect of stably controlling the sudden power-off operation and the power-on reset operation, thereby substantially preventing erroneous operations which may occur during the sudden power-off operation and the power-on reset operation.

An embodiment has an effect of stably controlling the power-on reset operation even in the case of a change in the characteristics of a transistor, thereby substantially preventing erroneous operations which may occur during the power-on reset operation.

Objects of the present disclosure are not limited to the aforementioned objects, and other objects not described above may be evidently understood by those skilled in the art, to which the present disclosure pertains, from the following description.

Figure 1:
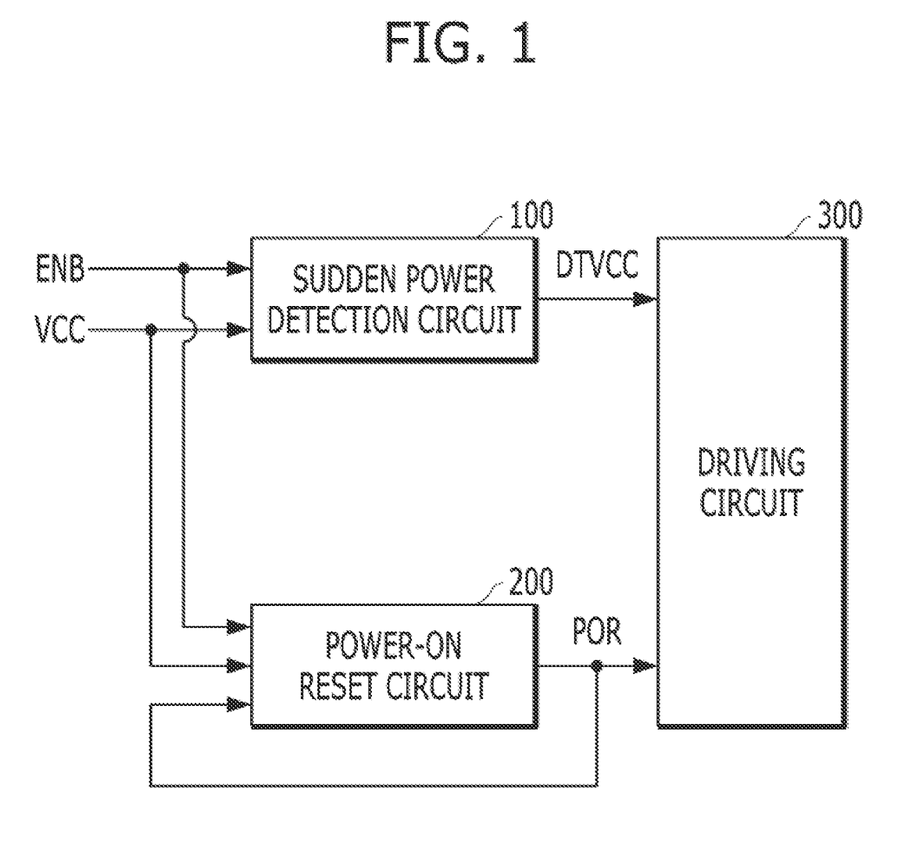
FIG. 1 is a block diagram illustrating a configuration of a semiconductor apparatus in accordance with an embodiment.

FIG. 1 is a block diagram illustrating a configuration of a semiconductor apparatus in accordance with an embodiment.

Referring to FIG. 1, the semiconductor apparatus may include a sudden power detection circuit 100, a power-on reset circuit 200, and a driving circuit 300.

First, the sudden power detection circuit 100 may be enabled based on an enable signal ENB and a power-on reset signal POR and may be configured to detect a voltage level of an external power supply voltage VCC and generate a sudden power detection signal DTVCC. Therefore, the sudden power detection circuit 100 may generate the sudden power detection signal DTVCC that is enabled when the voltage level of the external power supply voltage VCC is lowered below a set voltage level.

The enable signal ENB may be a signal for enabling and disabling the sudden power detection circuit 100. The enable signal ENB may enable the sudden power detection circuit 100. Furthermore, the enable signal ENB may be disabled when a sudden power-off operation has been completed and disable the sudden power detection circuit 100. For example, the enable signal ENB may be enabled during a sudden voltage drop or power-down period of the external power supply voltage VCC. The period of the enable signal ENB will be described again in FIG. 4.

Next, the power-on reset circuit 200 may be configured to set a reset reference voltage for a power-on reset operation based on the enable signal ENB. Furthermore, the power-on reset circuit 200 may be configured to detect the voltage level of the external power supply voltage VCC according to the reset reference voltage and generate the power-on reset signal POR. Therefore, the power-on reset circuit 200 may detect the voltage level of the external power supply voltage VCC according to the reset reference voltage set based on the enable signal ENB, and generate the power-on reset signal POR.

As will be described later, the power-on reset circuit 200 may set a first reset reference voltage corresponding to a disable time point of the power-on reset signal POR based on the enable signal ENB and the power-on reset signal POR during a power-up period of the external power supply voltage VCC. Furthermore, the power-on reset circuit 200 may set a second reset reference voltage corresponding to an enable time point of the power-on reset signal POR based on the enable signal ENB during a power-down period of the external power supply voltage VCC. Here, the power-on reset circuit 200 may set a voltage level of the first reset reference voltage corresponding to the power-up period and a voltage level of the second reset reference voltage corresponding to the power-down period to be different from each other. This will be described again in FIG. 4.

Next, the driving circuit 300 may be configured to perform the sudden power-off operation based on the sudden power detection signal DTVCC and to perform the power-on reset operation based on the power-on reset signal POR. The sudden power-off operation may be a discharging operation for a specific node included in the driving circuit 300. Furthermore, the power-on reset operation may be an initialization operation for the driving circuit 300 or an internal circuit included in the driving circuit 300. For example, the initialization operation may be an initialization operation for a circuit that is included in the semiconductor apparatus and generates internal power supply voltages, or an initialization operation for a latch circuit that stores an initial value during a program operation and a read operation of data.

The semiconductor apparatus in accordance with an embodiment may set the first and second reset reference voltages of the power-on reset circuit 200 based on the enable signal ENB corresponding to the enable period of the sudden power detection circuit 100, thereby stably controlling the power-on reset operation by the power-on reset circuit 200 and the sudden power-off operation by the sudden power detection circuit 100.

Figure 2:
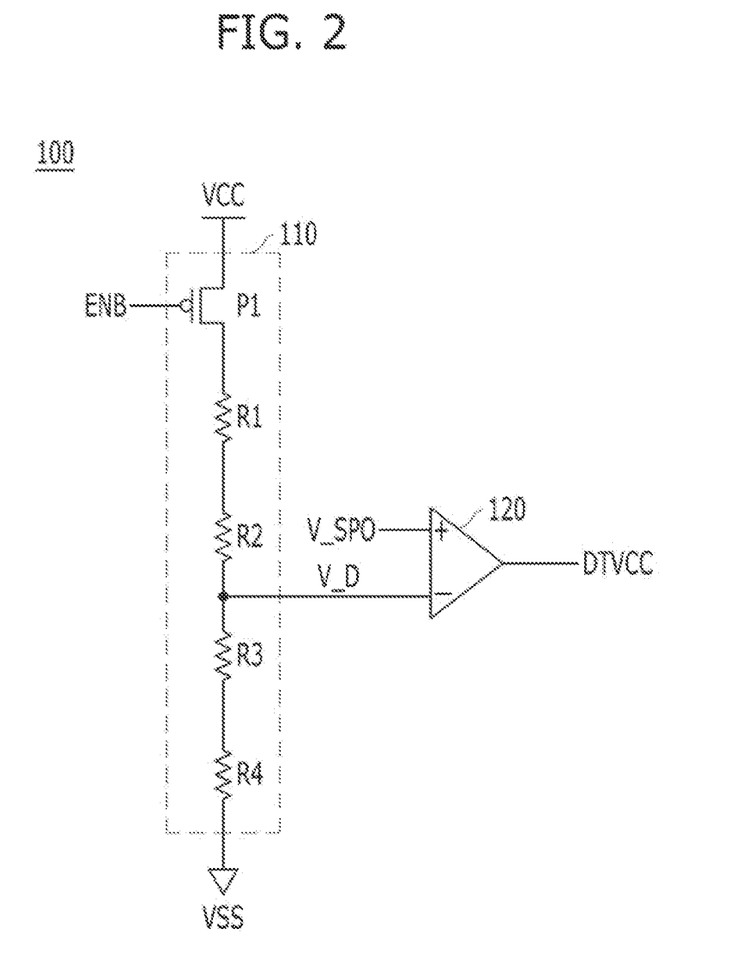
FIG. 2 is a circuit diagram illustrating a configuration of a sudden power detection circuit of FIG. 1.

FIG. 2 is a circuit diagram illustrating a configuration of the sudden power detection circuit 100 of FIG. 1.

Referring to FIG. 2, the sudden power detection circuit 100 may include a voltage division circuit 110 and a voltage comparison circuit 120.

First, the voltage division circuit 110 may be configured to generate a divided voltage V_D obtained by dividing the voltage level of the external power supply voltage VCC based on the enable signal ENB.

The voltage division circuit 110 may include a first PMOS transistor P1 and first to fourth resistors R1 to R4 serially connected between a voltage terminal to which the external power supply voltage VCC is applied and a voltage terminal to which a ground power supply voltage VSS is applied. The first PMOS transistor P1 may receive the enable signal ENB through a gate thereof, and the second resistor R2 and the third resistor R3 may be connected to a common node that outputs the divided voltage V_D.

Next, the voltage comparison circuit 120 may be configured to compare the divided voltage V_D and a sudden power reference voltage V_SPO and generate the sudden power detection signal DTVCC.

The voltage comparison circuit 120 may receive the sudden power reference voltage V_SPO through a (+) terminal thereof and the divided voltage through a (−) terminal thereof, and output the sudden power detection signal DTVCC. As will be described below with reference to FIG. 4, the sudden power reference voltage V_SPO may have a voltage level between the voltage level of the first reset reference voltage and the voltage level of the second reset reference voltage.

Figure 3:
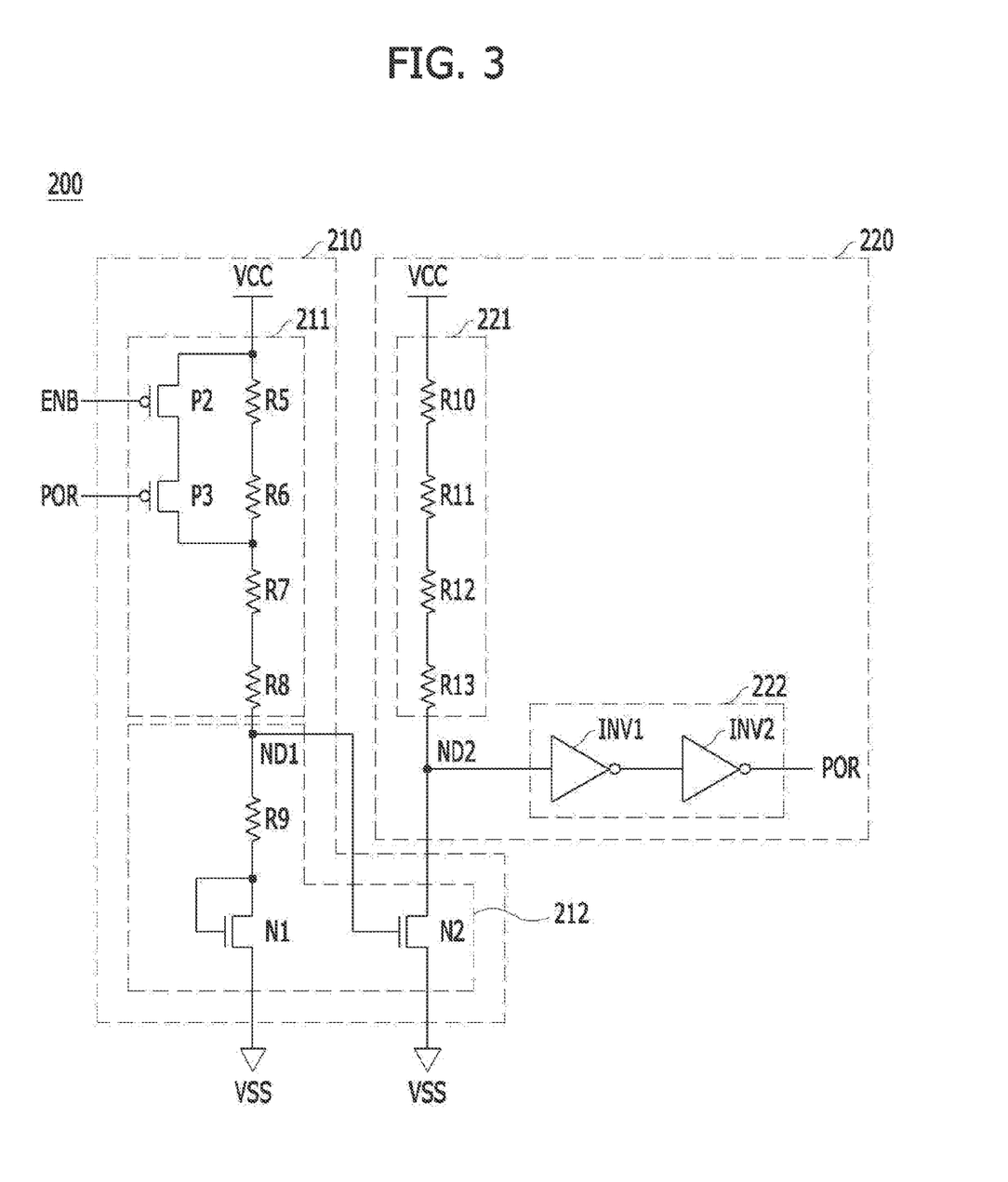
FIG. 3 is a circuit diagram illustrating a configuration of a power-on reset circuit of FIG. 1.

FIG. 3 is a circuit diagram illustrating a configuration of the power-on reset circuit 200 of FIG. 1.

Referring to FIG. 3, the power-on reset circuit 200 may include a voltage detection circuit 210 and a signal output circuit 220.

First, the voltage detection circuit 210 may be configured to set the reset reference voltage based on the enable signal ENB and the power-on reset signal POR. Furthermore, the voltage detection circuit 210 may be configured to detect the external power supply voltage VCC based on the set reset reference voltage. The voltage detection circuit 210 may include a resistance adjustment circuit 211 and a voltage sensing circuit 212.

The resistance adjustment circuit 211 may be configured to adjust a resistance value for a voltage drop of the external power supply voltage VCC based on the enable signal ENB and the power-on reset signal POR.

The resistance adjustment circuit 211 may include fifth to eighth resistors R5 to R8 serially connected to the voltage terminal to which the external power supply voltage VCC is applied. Furthermore, the resistance adjustment circuit 211 may include a second PMOS transistor P2 and a third PMOS transistor P3 serially connected to the voltage terminal to which the external power supply voltage VCC is applied. A gate of the second PMOS transistor P2 may receive the enable signal ENB and a gate of the third PMOS transistor P3 may receive the power-on reset signal POR. A resistor circuit including the fifth resistor R5 and the sixth resistor R6 and a transistor circuit including the second PMOS transistor P2 and the third PMOS transistor P3 may be connected in parallel.

For example, the second PMOS transistor P2 may be turned on or off based on the enable signal ENB, and the third PMOS transistor P3 may be turned on or off based on the power-on reset signal POR. Accordingly, when the enable signal ENB or the power-on reset signal POR becomes a logic 'high', the second PMOS transistor P2 or the third PMOS transistor P3 may be turned off. Therefore, a voltage drop of the external power supply voltage VCC may occur due to resistance values of the fifth to eighth resistors R5 to R8. Furthermore, when both the enable signal ENB and the power-on reset signal POR become a logic 'low', the second PMOS transistor P2 and the third PMOS transistor P3 may be turned on. Therefore, the external power supply voltage VCC may be bypassed through the second PMOS transistor P2 and the third PMOS transistor P3. Accordingly, the voltage drop of the external power supply voltage VCC may occur due to the resistance values of the seventh and eighth resistors R7 and R8, not the resistance values of the fifth and sixth resistors R5 and R6. Through such a configuration, the resistance adjustment circuit 211 may adjust the resistance value for the voltage drop of the external power supply voltage VCC based on the enable signal ENB and the power-on reset signal POR.

Next, the voltage sensing circuit 212 may be configured to sense the external power supply voltage VCC, which has been dropped by the resistance value adjusted by the resistance adjustment circuit 211, based on the reset reference voltage.

The voltage sensing circuit 212 may include a ninth resistor R9 and a first NMOS transistor N1 serially connected between the resistance adjustment circuit 211 and the voltage terminal to which the ground power supply voltage VSS is applied. A first node ND1 may be connected in common between the eighth resistor R8 and the ninth resistor R9, and the first NMOS transistor N1 may be connected in a diode type. Furthermore, the voltage sensing circuit 212 may include a second NMOS transistor N2 connected between a second node ND2 and the voltage terminal to which the ground power supply voltage VSS is applied. A gate of the second NMOS transistor N2 may be connected to the first node ND1.

For example, the voltage sensing circuit 212 may output the output voltage of the resistance adjustment circuit 211 to the first node ND1 as a sensing voltage. The second NMOS transistor N2 may be turned on or off based on the sensing voltage outputted from the first node ND1. When the second NMOS transistor N2 is turned on, the second node ND2 may be driven by the ground power supply voltage VSS. However, when the second NMOS transistor N2 is turned off, the second node ND2 may be driven to a level of a voltage that is outputted from a loading circuit 221 to be described below. Through such a configuration, the voltage sensing circuit 212 may determine the voltage level, at which the second node ND2 is driven, based on the sensed voltage.

For reference, when it is assumed that a threshold voltage of the second NMOS transistor N2 is constant, a voltage level of a sensed voltage, which corresponds to a reference at which the second NMOS transistor N2 may be turned on or off, may be constant. In such a case, the voltage level of the external power supply voltage VCC at which the second NMOS transistor N2 may be turned on or off may be changed according to the resistance value adjusted by the resistance adjustment circuit 211. Accordingly, the reset reference voltage of the semiconductor apparatus in accordance with an embodiment may refer to the voltage level of the external power supply voltage VCC at which the second NMOS transistor N2 may be turned on or off.

Meanwhile, the signal output circuit 220 may be configured to output the power-on reset signal POR based on the output signal of the voltage detection circuit 210. The signal output circuit 220 may include the loading circuit 221 and an output circuit 222.

First, the loading circuit 221 may be configured to receive the external power supply voltage VCC and transfer the external power supply voltage VCC to the second node ND2.

The loading circuit 221 may include tenth to thirteenth resistors R10 to R13 connected between the voltage terminal to which the external power supply voltage VCC is applied and the second node ND2. Accordingly, the loading circuit 221 may drop the external power supply voltage VCC and transfer the dropped external power supply voltage VCC to the second node ND2.

Next, the output circuit 222 may be configured to output the power-on reset signal POR based on the voltage level of the second node ND2.

Figure 4:
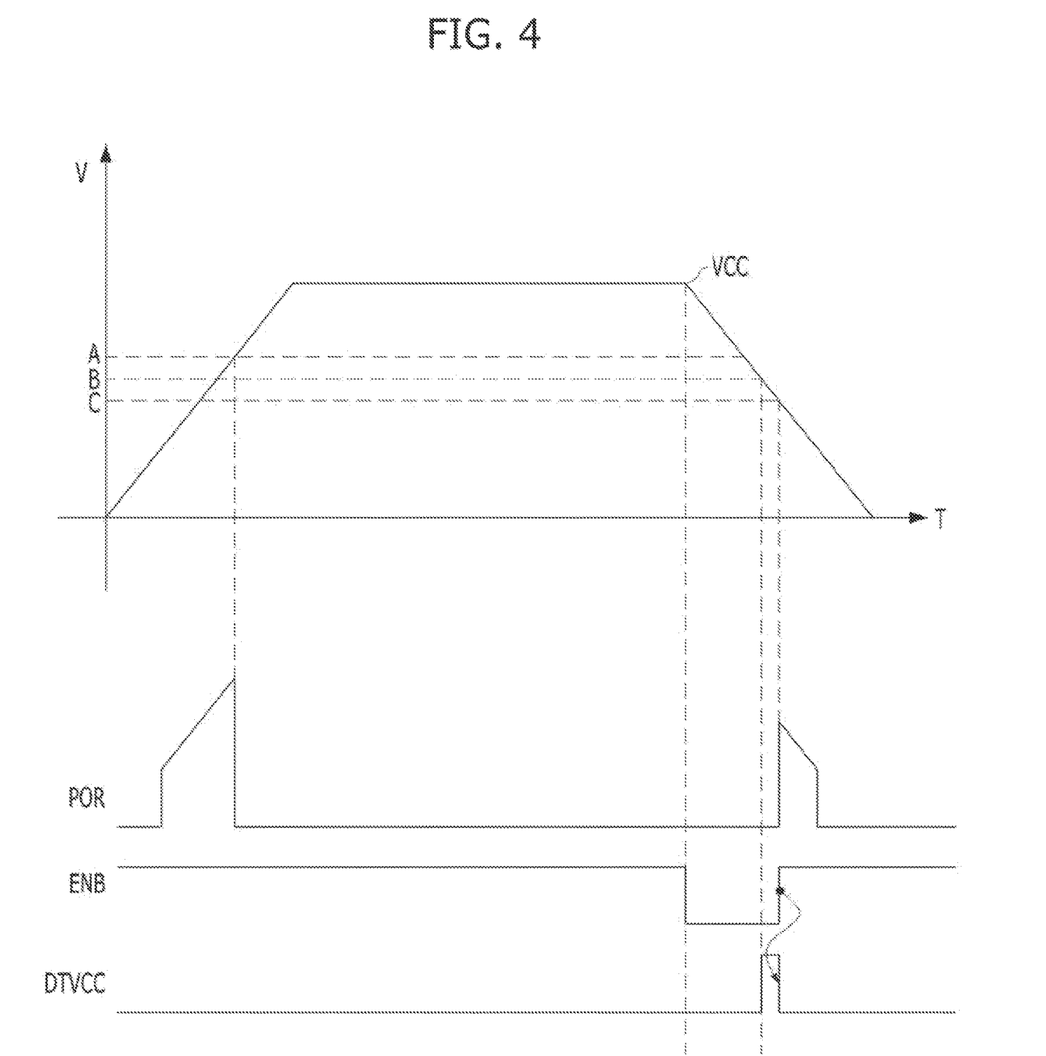
FIG. 4 is a timing diagram illustrating an operating timing of the semiconductor apparatus of FIG. 1.

The output circuit 222 may include a first inverter circuit INV1 that receives an output voltage of the second node ND2 and a second inverter circuit INV2 that receives an output signal of the first inverter circuit INV1 and outputs the power-on reset signal POR. As described above, the voltage level of the second node ND2 may be determined based on the output signals of the voltage sensing circuit 212 and the loading circuit 221. Accordingly, the output circuit 222 may output the power-on reset signal POR based on the output signals of the voltage sensing circuit 212 and the loading circuit 221, FIG. 4 is a timing diagram illustrating an operating timing of the semiconductor apparatus of FIG. 1.

Referring to FIG. 1 to FIG. 4, the voltage level of the external power supply voltage VCC may gradually increase during the power-up period. Since the voltage obtained by dropping the external power supply voltage VCC is transferred to the second node ND2 of FIG. 3, the voltage level of the second node ND2 may also increase. Accordingly, the power-on reset signal POR may become a logic 'high', Accordingly, the driving circuit 300 of FIG. 1 may perform the power-on reset operation based on the power-on reset signal POR. That is, the driving circuit 300 may perform the initialization operation based on the power-on reset signal POR.

Then, when the voltage level of the external power supply voltage VCC increases to a voltage level 'A', the voltage level of the sensing voltage generated at the first node ND1 of FIG. 3 may also increase according to the external power supply voltage VCC. At this time, since the power-on reset signal POR is a logic 'high', the third PMOS transistor P3 may be turned off. Accordingly, the resistance adjustment circuit 211 may reflect the resistance values of the fifth to eighth resistors R5 to R8 in the external power supply voltage VCC. In other words, the sensing voltage generated at the first node ND1 may have a voltage level dropped by the resistance values of the fifth to eighth resistors R5 to R8 to the external power supply voltage VCC. Then, the second NMOS transistor N2 may be turned on according to the sensing voltage generated at the first node ND1. Therefore, the second node ND2 may be driven by the ground power supply voltage VSS. Accordingly, the power-on reset signal POR may transition from a logic 'high' to a logic 'low', For convenience of description, the voltage level 'A', at the time when the power-on reset signal POR is disabled, may be defined as the 'first reset reference voltage'.

Meanwhile, the voltage level of the external power supply voltage VCC may gradually decrease during the power-down period. The power-down period may be in a sudden power-off state, and the enable signal ENB may transition from a logic 'high' to a logic 'low'. The sudden power detection circuit 100 of FIG. 2 may be enabled based on the enable signal ENB having the logic 'low'. Then, since the divided voltage V_D is a voltage obtained by dividing the external power supply voltage VCC, the voltage level of the divided voltage V_D may also decrease. At this time, since both the enable signal ENB and the power-on reset signal POR are logic 'low', both the second PMOS transistor P2 and the third PMOS transistor P3 of FIG. 3 may be turned on. Therefore, the sensing voltage generated at the first node ND1 of FIG. 3 may have a voltage level at which the fifth resistor R5 and the sixth resistor R6 are not reflected in the external power supply voltage VCC. Accordingly, even though the voltage level of the external power supply voltage VCC is lowered below the voltage level 'A' which is the first reset reference voltage, the second PMOS transistor P2 may substantially maintain the turned-on state. That is, the power-on reset signal POR might not transition from a logic 'low' to a logic 'high'.

Meanwhile, the external power supply voltage VCC may be lowered from the voltage level 'A' to a voltage level 'B'. The sudden power reference voltage V_SPO of FIG. 2 may have a voltage level corresponding to the voltage level 'B'. Accordingly, when the voltage level of the external power supply voltage VCC is lowered below the voltage level 'B', the sudden power detection signal DTVCC may transition from a logic 'low' to a logic 'high'. The driving circuit 300 of FIG. 1 may perform the sudden power-off operation based on the sudden power detection signal DTVCC. That is, the driving circuit 300 may perform a discharging operation of a specific node based on the sudden power detection signal DTVCC.

Then, when the sudden power-off operation by the sudden power detection circuit 100 of FIG. 1 is completed, the enable signal ENB may transition from a logic 'low' to a logic 'high'. Furthermore, the sudden power detection signal DTVCC may transition from a logic 'high' to a logic 'low' based on the enable signal ENB. At this time, the second PMOS transistor P2 of FIG. 3 may be turned off based on the enable signal ENB. Therefore, the sensing voltage generated at the first node ND1 may have a voltage level dropped by the resistance values of the fifth to eighth resistors R5 to R8 to the external power supply voltage VCC. Accordingly, the second NMOS transistor N2 may be turned off and the power-on reset signal POR may transition from a logic 'low' to a logic 'high'. The driving circuit 300 of FIG. 1 may perform the power-on reset operation based on the power-on reset signal POR. For convenience of description, a voltage level 'C', at the time when the power-on reset signal POR is enabled, may be defined as the 'second reset reference voltage'.

As can be seen from the timing diagram of FIG. 4, the voltage level 'A', which is the first reset reference voltage, and the voltage level 'C', which is the second reset reference voltage, may be different from each other. That is, the voltage level 'A', which is the first reset reference voltage, may be higher than the voltage level 'C' which is the second reset reference voltage. Furthermore, the voltage level 'B', which is the sudden power reference voltage V_SPO, may have a voltage level between the voltage level 'A', which is the first reset reference voltage, and the voltage level 'C' which is the second reset reference voltage.

Meanwhile, as can be seen from the timing diagram of FIG. 4, the power-on reset signal POR may be a logic 'high' during the period in which the external power supply voltage VCC increases to the voltage level 'A' which is the first reset reference voltage and during the period in which the external power supply voltage VCC is lowered below the voltage level 'C' which is the second reset reference voltage. Furthermore, the enable period of the power-on reset signal POR and the enable period of the sudden power detection signal DTVCC might not overlap each other. In other words, the period of the sudden power-off operation performed based on the sudden power detection signal DTVCC and the period of the power-on reset operation performed based on the power-on reset signal POR might not overlap each other. That is, the semiconductor apparatus in accordance with an embodiment may substantially prevent the power-on reset operation from being performed during the period of the sudden power-off operation. Consequently, the semiconductor apparatus may stably guarantee the sudden power-off operation and the power-on reset operation.

Figure 5:
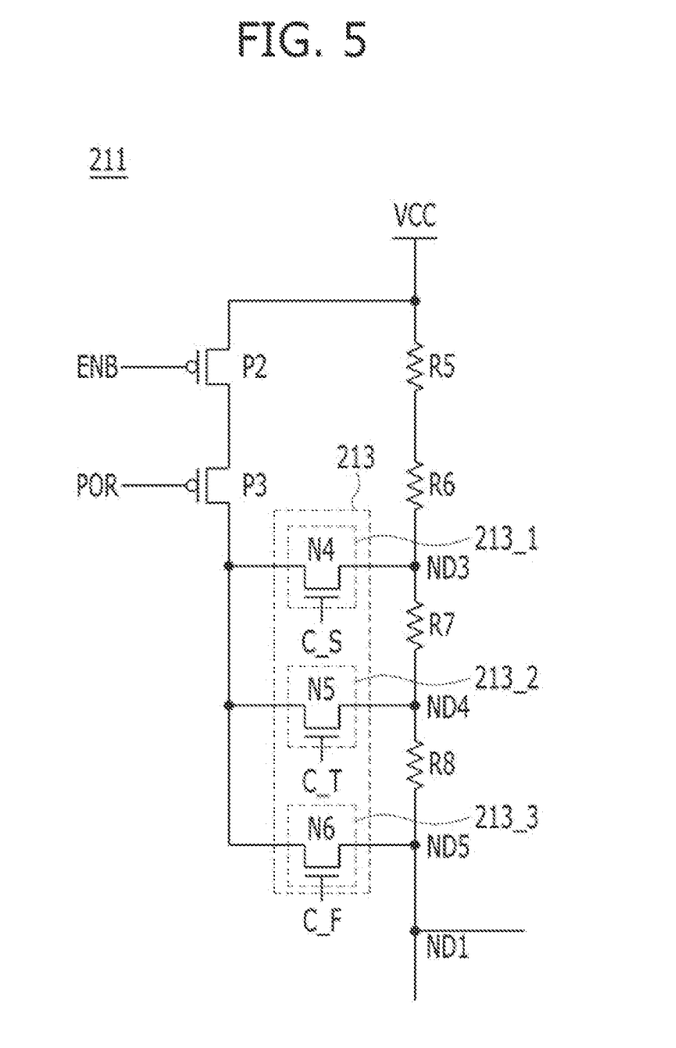
FIG. 5 is a block diagram illustrating a partial configuration of the semiconductor apparatus in accordance with an embodiment.

FIG. 5 is a block diagram illustrating a partial configuration of the semiconductor apparatus in accordance with an embodiment.

Prior to the description, in general, in the semiconductor apparatus, the characteristics of a transistor provided therein may be changed according to a process, voltage, temperature (PVT) skew based on a process, a voltage, and a temperature. Accordingly, the semiconductor apparatus in accordance with an embodiment may stably control the power-on reset operation by adjusting the reset reference voltage according to the PVT skew.

Referring to FIG. 5, the semiconductor apparatus may include a skew adjustment circuit 213 for adjusting the reset reference voltage based on first to third skew control signals C_S, C_T, and C_F which are skew control signals corresponding to the PVT skew. The skew adjustment circuit 213 may be a component added to the configuration of FIG. 3. Accordingly, the components corresponding to each other in FIG. 3 and FIG. 5 may be denoted by substantially the same reference numerals.

The skew adjustment circuit 213 may be configured to selectively control a resistance path of the external power supply voltage VCC based on the first to third skew control signals C_S, C_T, and C_F. The skew adjustment circuit 213 may include a first path bypass circuit 213_1, a second path bypass circuit 213_2, and a third path bypass circuit 213_3.

First, the first path bypass circuit 213_1 may be configured to select a resistance path, through which the external power supply voltage VCC bypasses the fifth resistor R5 and the sixth resistor R6, based on the first skew control signal C_S. The first path bypass circuit 213_1 may include a fourth NMOS transistor N4 connected between a drain terminal of the third PMOS transistor P3 and a third node ND3. A gate of the fourth NMOS transistor N4 may be connected to the first skew control signal C_S. Accordingly, the fourth NMOS transistor N4 may be turned on or off based on the first skew control signal C_S. The first skew control signal C_S may be a signal that is enabled when the transistor has a 'SLOW' characteristic according to the PVT skew. Accordingly, the first path bypass circuit 213_1 may turn on the fourth NMOS transistor N4 when the transistor has the 'SLOW' characteristic, thereby forming the resistance path through which the external power supply voltage VCC bypasses the fifth resistor R5 and the sixth resistor R6.

Next, the second path bypass circuit 213_2 may be configured to select a resistance path, through which the external power supply voltage VCC bypasses the fifth resistor R5, the sixth resistor R6, and the seventh resistor R7 based on the second skew control signal C_T. The second path bypass circuit 213_2 may include a fifth NMOS transistor N5 connected between the drain terminal of the third PMOS transistor P3 and a fourth node ND4, A gate of the fifth NMOS transistor N5 may be connected to the second skew control signal C_T. The second skew control signal C_T may be a signal that is enabled when the transistor has a 'TYPICAL' characteristic according to the PVT skew. Accordingly, the second path bypass circuit 213_2 may turn on the fifth NMOS transistor N5 when the transistor has the 'TYPICAL' characteristic thereby forming the resistance path through which the external power supply voltage VCC bypasses the fifth resistor R5, the sixth resistor R6, and the seventh resistor R7.

Next, the third path bypass circuit 213_3 may be configured to select a resistance path, through which the external power supply voltage VCC bypasses the fifth to eighth resistors R8 based on the third skew control signal C_F. The third path bypass circuit 213_3 may include a sixth NMOS transistor N6 connected between the drain terminal of the third PMOS transistor P3 and a fifth node ND5. A gate of the sixth NMOS transistor N6 may be connected to the third skew control signal C_F that is enabled when the transistor has a 'FAST' characteristic according to the PVT skew. The third path bypass circuit 213_3 may form the resistance path through which the external power supply voltage VCC bypasses the fifth to eighth resistors R5 to R8 when the transistor has the 'FAST' characteristic.

As described above, the skew adjustment circuit 213 may be composed of three NMOS transistors, that is, the fourth to sixth NMOS transistors N4 to N6, for example. Furthermore, the skew adjustment circuit 213 may also be composed of three PMOS transistors in consideration of a voltage drop for a transmitted signal.

In brief, the skew adjustment circuit 213 may adjust the number of resistors reflected in the external power supply voltage VCC by selecting the resistance path according to the PVT skew. The fact that adjusting the number of resistors reflected in the external power supply voltage VCC means that the reset reference voltage may be adjusted. That is, the skew adjustment circuit 213 may adjust the reset reference voltage by adjusting the resistance path according to the PVT skew. Accordingly, the semiconductor apparatus in accordance with an embodiment may stably generate the power-on reset signal POR even though the PVT skew exists.

Figure 6:
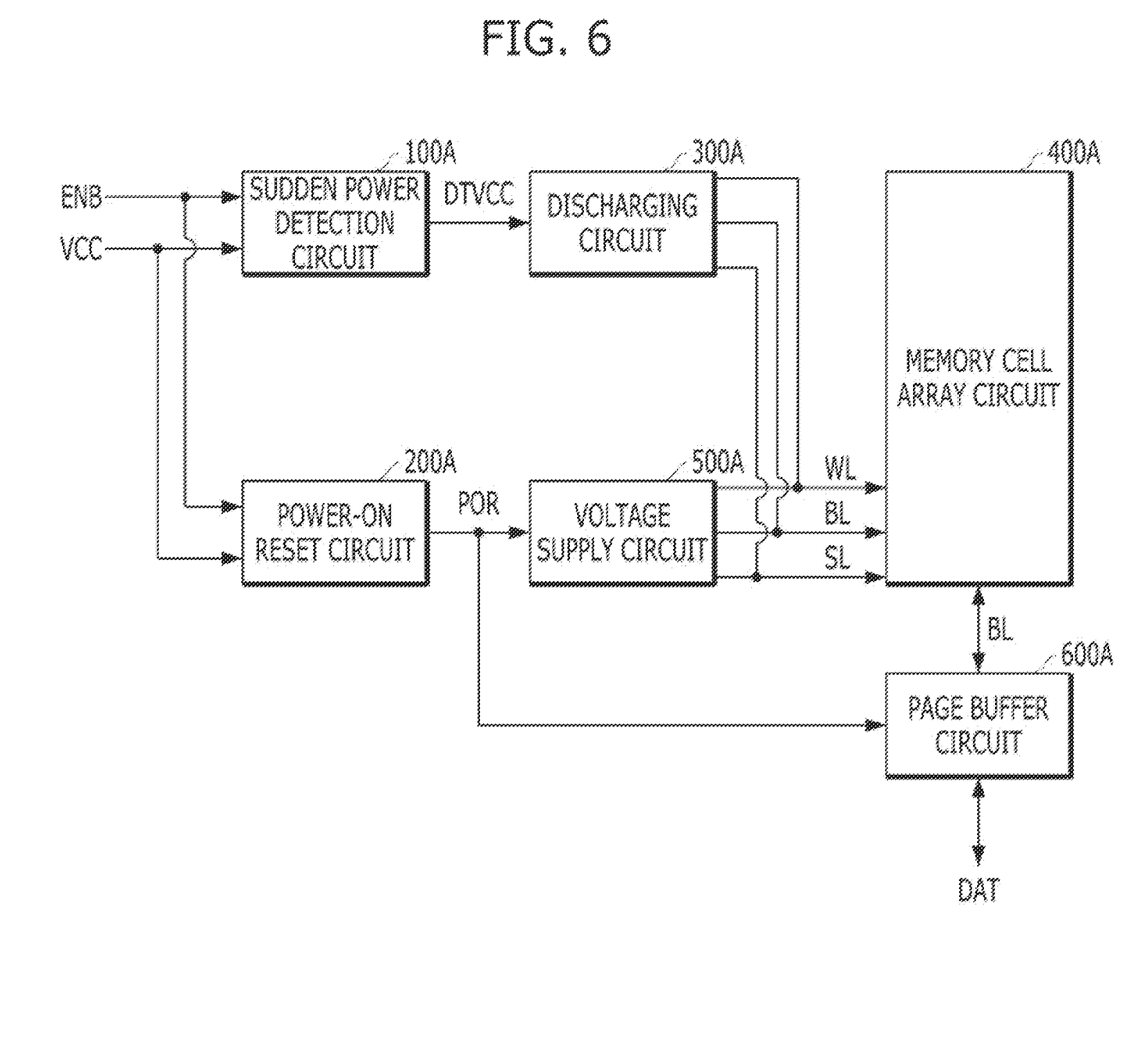
FIG. 6 is a block diagram illustrating a configuration of a semiconductor memory apparatus in accordance with an embodiment.

FIG. 6 is a block diagram illustrating a configuration of a semiconductor memory apparatus in accordance with an embodiment.

Referring to FIG. 6, the semiconductor memory apparatus may include a sudden power detection circuit 100A, a power-on reset circuit 200A, and a discharging circuit 300A.

First, the sudden power detection circuit 100A may be enabled based on the enable signal ENB and may be configured to detect the voltage level of the external power supply voltage VCC and generate the sudden power detection signal DTVCC. Therefore, the sudden power detection circuit 100 may generate the sudden power detection signal DTVCC that is enabled when the voltage level of the external power supply voltage VCC is lowered below a set voltage level.

Next, the power-on reset circuit 200A may be configured to set the reset reference voltage for the power-on reset operation based on the enable signal ENB. Furthermore, the power-on reset circuit 200A may be configured to detect the voltage level of the external power supply voltage VCC according to the reset reference voltage and generate the power-on reset signal POR. Therefore, the power-on reset circuit 200A may detect the voltage level of the external power supply voltage VCC according to the reset reference voltage set based on the enable signal ENB and generate the power-on reset signal POR.

The sudden power detection circuit 100A and the power-on reset circuit 200A may correspond to the sudden power detection circuit 100 and the power-on reset circuit 200 of FIG. 1, respectively. Since the sudden power detection circuit 100A and the power-on reset circuit 200A have been described with reference to FIG. 1 to FIG. 5, descriptions on configurations and operations thereof may be omitted.

Next, the discharging circuit 300A may be configured to perform a discharging operation on at least one of a word line WL, a bit line BL, and a source line SL, which are lines connected to a memory cell, based on the sudden power detection signal DTVCC.

In the semiconductor memory apparatus in accordance with an embodiment, the enable period of the sudden power detection signal DTVCC for the sudden power-off operation and the enable period of the power-on reset signal POR for the power-on reset operation might not overlap each other. Accordingly, during the sudden power-off operation, stable discharging operations on the word line WL, the bit line BL, and the source line SL may be guaranteed based on the sudden power detection signal DTVCC.

Meanwhile, the semiconductor memory apparatus in accordance with an embodiment may include a memory cell array circuit 400A, a voltage supply circuit 500A, and a page buffer circuit 600A.

First, the memory cell array circuit 400A may include a plurality of memory cells (not illustrated) that are connected to the word line WL, the bit line BL, and the source line SL, and store data. Next, the voltage supply circuit 500A may be configured to supply corresponding internal power supply voltages to the word line WL, the bit line BL, and the source line SL according to the program operation, the read operation, and the erase operation. Next, the page buffer circuit 600A may be configured to transmit data to the memory cell array circuit 400A or receive data stored in the memory cell array circuit 400A through the bit line BL.

The voltage supply circuit 500A may perform an initialization operation based on the power-on reset signal POR. The voltage supply circuit 500A may include a plurality of voltage generation circuits (not illustrated) for generating the internal power supply voltages supplied to the word line WL, the bit line BL, and the source line SL. Therefore, the plurality of voltage generation circuits may perform the initialization operation based on the power-on reset signal POR. Furthermore, the page buffer circuit 600A may perform the initialization operation based on the power-on reset signal POR. The page buffer circuit 600A may include a plurality of latch circuits. In the plurality of latch circuits, an initial value may be set before the program operation and the read operation are performed. Therefore, the plurality of latch circuits may perform the initialization operation, in which the initial value is set, based on the power-on reset signal POR.

The semiconductor memory apparatus in accordance with an embodiment may stably control the sudden power-off operation and the power-on reset operation, thereby substantially preventing erroneous operations which may occur during the sudden power-off operation and the power-on reset operation.

Effects of the present disclosure are not limited to the aforementioned effects, and other effects not described above may be evidently understood by those skilled in the art, to which the present disclosure pertains, from the above description.

Although various embodiments have been described for illustrative purposes, it will be apparent to those skilled in the art that various changes and modifications may be made without departing from the spirit and scope of the disclosure as defined in the following claims.

What is claimed is:

1. A semiconductor apparatus comprising:
   a sudden power detection circuit enabled based on an enable signal and configured to detect a voltage level of an external power supply voltage and generate a sudden power detection signal;
   a power-on reset circuit configured to set a reset reference voltage for a power-on reset operation based on the enable signal and a power-on reset signal, to detect the voltage level of the external power supply voltage according to the reset reference voltage, and to generate the power-on reset signal; and
   a driving circuit configured to perform a sudden power-off operation based on the sudden power detection signal and to perform the power-on reset operation based on the power-on reset signal.

2. The semiconductor apparatus according to claim 1, wherein the sudden power-off operation includes a discharging operation for a specific node of the driving circuit, and the power-on reset operation includes an initialization operation for the driving circuit.

3. The semiconductor apparatus according to claim 1, wherein the reset reference voltage includes a first reset reference voltage corresponding to a power-up period of the external power supply voltage and a second reset reference voltage corresponding to a power-down period of the external power supply voltage.

4. The semiconductor apparatus according to claim 3, wherein the first reset reference voltage and the second reset reference voltage have different voltage levels.

5. The semiconductor apparatus according to claim 3, wherein a voltage level of the first reset reference voltage is higher than a voltage level of the second reset reference voltage.

6. The semiconductor apparatus according to claim 3, wherein the sudden power detection circuit comprises:
   a voltage division circuit configured to generate a divided voltage by dividing a voltage level of the external power supply voltage based on the enable signal; and
   a voltage comparison circuit configured to compare the divided voltage and a sudden power reference voltage and generate the sudden power detection signal.

7. The semiconductor apparatus according to claim 6, wherein a voltage level of the sudden power reference voltage includes a voltage level between a voltage level of the first reset reference voltage and a voltage level of the second reset reference voltage.

8. The semiconductor apparatus according to claim 1, wherein the power-on reset circuit comprises:
   a voltage detection circuit configured to set the reset reference voltage based on the enable signal and the power-on reset signal and detect the external power supply voltage based on the set reset reference voltage; and
   a signal output circuit configured to output the power-on reset signal based on an output signal of the voltage detection circuit.

9. The semiconductor apparatus according to claim 8, wherein the voltage detection circuit comprises:
   a resistance adjustment circuit configured to adjust a resistance value for a voltage drop of the external power supply voltage based on the enable signal and the power-on reset signal; and
   a voltage sensing circuit configured to sense the external power supply voltage, which has been dropped by the resistance value adjusted by the resistance adjustment circuit, based on the reset reference voltage.

10. The semiconductor apparatus according to claim 8, wherein the signal output circuit comprises:
- a loading circuit configured to receive the external power supply voltage; and
- an output circuit configured to output the power-on reset signal based on an output signal of the loading circuit and the output signal of the voltage detection circuit.

11. The semiconductor apparatus according to claim 1, wherein the power-on reset circuit further comprises:
- a skew adjustment circuit configured to further receive skew control signals corresponding to a process, voltage, temperature (PVT) skew, and to adjust the reset reference voltage based on the skew control signals.

12. The semiconductor apparatus according to claim 11, wherein the skew adjustment circuit selectively controls a resistance path of the external power supply voltage based on the skew control signals.

13. A semiconductor memory apparatus comprising:
- a sudden power detection circuit enabled based on an enable signal and configured to detect a voltage level of an external power supply voltage and generate a sudden power detection signal;
- a power-on reset circuit configured to set a reset reference voltage for a power-on reset operation based on the enable signal and a power-on reset signal, to detect the voltage level of the external power supply voltage according to the reset reference voltage, and to generate the power-on reset signal; and
- a discharging circuit configured to perform a discharging operation on a line connected to a memory cell, based on the sudden power detection signal.

14. The semiconductor memory apparatus according to claim 13, further comprising:
- a memory cell array circuit including a plurality of memory cells that are connected to a word line, a bit line, and a source line and are configured to store data,
- wherein the discharging circuit performs the discharging operation on at least one of the word line, the bit line, and the source line based on the sudden power detection signal.

15. The semiconductor memory apparatus according to claim 14, further comprising:
- a voltage supply circuit configured to supply internal power supply voltages to the word line, the bit line, and the source line; and
- a page buffer circuit configured to transmit and receive (transmit/receive) data to and from (to/from) the memory cell array circuit through the bit line,
- wherein at least one of the voltage supply circuit and the page buffer circuit is initialized based on the power-on reset signal.

16. The semiconductor memory apparatus according to claim 13, wherein the reset reference voltage includes a first reset reference voltage corresponding to a power-up period of the external power supply voltage and a second reset reference voltage corresponding to a power-down period of the external power supply voltage.

17. The semiconductor memory apparatus according to claim 16, wherein the first reset reference voltage and the second reset reference voltage have different voltage levels.

18. The semiconductor memory apparatus according to claim 16, wherein a voltage level of the first reset reference voltage is higher than a voltage level of the second reset reference voltage.

19. The semiconductor memory apparatus according to claim 13, wherein the power-on reset circuit comprises:
- a voltage detection circuit configured to set the reset reference voltage based on the enable signal and the power-on reset signal and detect the external power supply voltage based on the set reset reference voltage; and
- a signal output circuit configured to output the power-on reset signal based on an output signal of the voltage detection circuit.

20. The semiconductor memory apparatus according to claim 19, wherein the voltage detection circuit comprises:
- a resistance adjustment circuit configured to adjust a resistance value for a voltage drop of the external power supply voltage based on the enable signal and the power-on reset signal; and
- a voltage sensing circuit configured to sense the external power supply voltage, which has been dropped by the resistance value adjusted by the resistance adjustment circuit, based on the reset reference voltage.

* * * * *